United States Patent
Chambon

(10) Patent No.: US 9,490,689 B2
(45) Date of Patent: Nov. 8, 2016

(54) METHODS AND APPARATUS FOR CONTROLLING POWER SWITCHES VIA A DIGITAL COMMUNICATION BUS

(75) Inventor: Patrick Chambon, Saint Martin d'Heres (FR)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 122 days.

(21) Appl. No.: 14/370,824

(22) PCT Filed: Jan. 5, 2012

(86) PCT No.: PCT/IB2012/000161
§ 371 (c)(1),
(2), (4) Date: Sep. 11, 2014

(87) PCT Pub. No.: WO2013/102779
PCT Pub. Date: Jul. 11, 2013

(65) Prior Publication Data
US 2015/0023080 A1   Jan. 22, 2015

(51) Int. Cl.
*H02M 7/44* (2006.01)
*H02M 1/084* (2006.01)
(Continued)

(52) U.S. Cl.
CPC ........... *H02M 1/084* (2013.01); *H02M 1/0845* (2013.01); *H02M 1/38* (2013.01);
(Continued)

(58) Field of Classification Search
CPC ...... H02M 1/084; H02M 7/537; H02M 1/32; H02M 1/38; H02M 7/53873; H02M 1/0845; H02M 7/487; H02M 2001/0012; H03K 17/04; G06F 1/18
USPC .......... 363/55, 71, 72, 95, 98, 131; 375/257, 375/258
See application file for complete search history.

(56) References Cited

U.S. PATENT DOCUMENTS 6,031,749 A * 2/2000 Covington ............ H02M 5/458
363/132
(Continued)

FOREIGN PATENT DOCUMENTS

CH   WO 2011113492 A1 * 9/2011 .............. H02M 1/32
EP   2346155 A1       7/2011

OTHER PUBLICATIONS

International Search Report and Written Opinion dated Jan. 23, 2013 for PCT/IB2012/000161.
(Continued)

*Primary Examiner* — Adolf Berhane
*Assistant Examiner* — Alex Torres-Rivera
(74) *Attorney, Agent, or Firm* — Lando & Anastasi, LLP

(57) ABSTRACT

Methods and apparatus are provided that can be used to control a set of power switches operating as a power converter. The method comprises providing a set of power switches and at least one switch driver, each power switch being operable to connect and disconnect one of a set of input power line to an output power line, each switch driver setting the state(s) of an associated power switch or switches; generating by a controller a set of switch commands, each command indicating a desired state of a respective one of said power switches at a moment in time; sending each switch command from the controller to a driver module containing the switch driver associated with the respective power switch; receiving at each driver module switch commands for its associated power switch(es) and causing each switch driver to set the state(s) of the appropriate power switch(es) accordingly; wherein the step of sending said switch commands comprises multiplexing commands for at least a subset of said switches into a series of multi-bit command frames and transmitting said command frames on a serial communication channel, and wherein the step of receiving said switch commands comprises receiving said multi-bit command frames from said communication channel and extracting individual switch commands therefrom. The method and apparatus can be used for example in a UPS system.

42 Claims, 6 Drawing Sheets

(51) Int. Cl.
*H02M 1/38* (2007.01)
*H02M 7/5387* (2007.01)
*H02M 7/537* (2006.01)
*H03K 17/04* (2006.01)
*H02M 1/00* (2006.01)
*H02M 7/487* (2007.01)

(52) U.S. Cl.
CPC ....... *H02M 7/537* (2013.01); *H02M 7/53873* (2013.01); *H03K 17/04* (2013.01); *H02M 7/487* (2013.01); *H02M 2001/0012* (2013.01)

(56) References Cited

U.S. PATENT DOCUMENTS

| | | | |
|---|---|---|---|
| 7,738,568 B2* | 6/2010 | Alfano | H01L 23/66 375/258 |
| 2004/0227404 A1 | 11/2004 | Boros et al. | |
| 2006/0044025 A1 | 3/2006 | Grbovic | |
| 2006/0279969 A1 | 12/2006 | Leung et al. | |
| 2007/0094524 A1 | 4/2007 | Kris | |
| 2010/0295523 A1 | 11/2010 | Grbovic | |
| 2011/0134675 A1 | 6/2011 | Grbovic | |
| 2011/0170323 A1* | 7/2011 | Fulcher | H02J 3/38 363/65 |
| 2011/0222323 A1* | 9/2011 | Dofnas | H02M 7/483 363/71 |
| 2011/0310644 A1* | 12/2011 | Ogura | H02M 7/5387 363/55 |
| 2013/0128628 A1* | 5/2013 | Venhaus | H02M 7/49 363/34 |
| 2013/0229835 A1* | 9/2013 | Yamanaka | H02M 5/4585 363/37 |

OTHER PUBLICATIONS

"PMBus (TM) Power System Management Protocol Specification Part I—General Requirements, Transport and Electrical Interface," System Management Interface Forum, Feb. 5, 2007, pp. 1-19, XP002689665, Retrieved from the Internet: URL:http://pmbus.org/docs/PMBus_Specification_Part_I_Rev_1-1_20070205.pdf [retrieved on Dec. 21, 2012].

* cited by examiner

METHODS AND APPARATUS FOR CONTROLLING POWER SWITCHES VIA A DIGITAL COMMUNICATION BUS

FIELD

The invention relates generally to power converters, and more particularly to methods and apparatus for controlling power switches, which may operate for example in an uninterruptible power supply (UPS) system.

BACKGROUND

Power converters provide an adjustable voltage and frequency to an output through a Pulse Width Modulated (PWM) voltage source inverter drive. A typical power converter is a switching apparatus having two or more power semiconductor devices such as power semiconductor switches which can be abbreviated as power switches. A power switch can, for example, be implemented by an insulated-gate bipolar transistor (IGBT) or a metal-oxide-semiconductor field-effect transistor (MOSFET).

Power converters can be used in an uninterruptible power supply (UPS) system, electric motors, etc. A PWM signal is used in the power converter for controlling power to inertial electrical devices. A duty cycle of a power switch (ratio of on-time to total cycle time) is varied to achieve a desired average output voltage, current etc., when averaged over time.

A large UPS system may use a centralized core controller. FIG. 7 shows a schematic diagram of a conventional system for use in a power converter such as a UPS system. PWM signals such as IGBT switch commands are distributed through individual wires 821-829 from the controller 800 to a number of power switches 191-199. These individual wires 821-829 are often grouped together as ribbon cables. To drive a power converter, it is necessary to send switch command signals to a driver board through an individual wire.

The number of switch commands in a UPS system may increase in future. The increased number of PWM signals, combined with the length of the wires, brings a challenge to the reliability of a power converter such as a UPS system, as the reliability of an electronic system is often linked to the number of connector pins, and the reliability of a UPS system will decline with the increase of the number of connector pins and wires. Switch commands are fast and critical signals, which are sensitive to noise over the length of a wire. The increase of the number of wires also makes the cost of cables and connector pins high and occupies more space within a UPS system.

SUMMARY

Methods and apparatus are provided that can be used to control a set of power switches operating as a power converter.

According to an embodiment of the invention, there is provided a method of controlling a set of power switches operating as a power converter. The method comprises providing a set of power switches and at least one switch driver, each power switch being operable to connect and disconnect one of a set of input power line to an output power line, each switch driver setting the state(s) of an associated power switch or switches; generating by a controller a set of switch commands, each command indicating a desired state of a respective one of said power switches at a moment in time; sending each switch command from the controller to a driver module containing the switch driver associated with the respective power switch; receiving at each driver module switch commands for its associated power switch(es) and causing each switch driver to set the state(s) of the appropriate power switch(es) accordingly; wherein the step of sending said switch commands comprises multiplexing commands for at least a subset of said switches into a series of multi-bit command frames and transmitting said command frames on a serial communication channel, and wherein the step of receiving said switch commands comprises receiving said multi-bit command frames from said communication channel and extracting individual switch commands therefrom.

According to another embodiment of the invention, there is provided a controller for use in a power converter having a set of power switches. The controller is configured to: generate a set of switch commands, each switch command indicating a desired state of a respective one of said power switches of the power converter at a moment in time; multiplex commands for at least a subset of said power switches into a series of multi-bit command frames; send the command frames on a serial communication channel to a driver module associated with the respective power switch.

According to a further embodiment, there is provided a driver module for use in a power converter having a set of power switches. The driver module is configured to: receive over a serial communication channel a series of multi-bit command frames from a controller, said multi-bit command frames including switch commands for its associated power switch(es), each command indicating a desired state of a respective one of said power switches at a moment in time; extract individual switch commands from the multi-bit command frames; set the state(s) of the appropriate power switch(es) accordingly.

According to a still further embodiment of the invention, there is provided a power converter apparatus. The power converter apparatus comprises at least one above-mentioned controller, and at least one above-mentioned driver module.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings.

DETAILED DESCRIPTION

Figure 1:
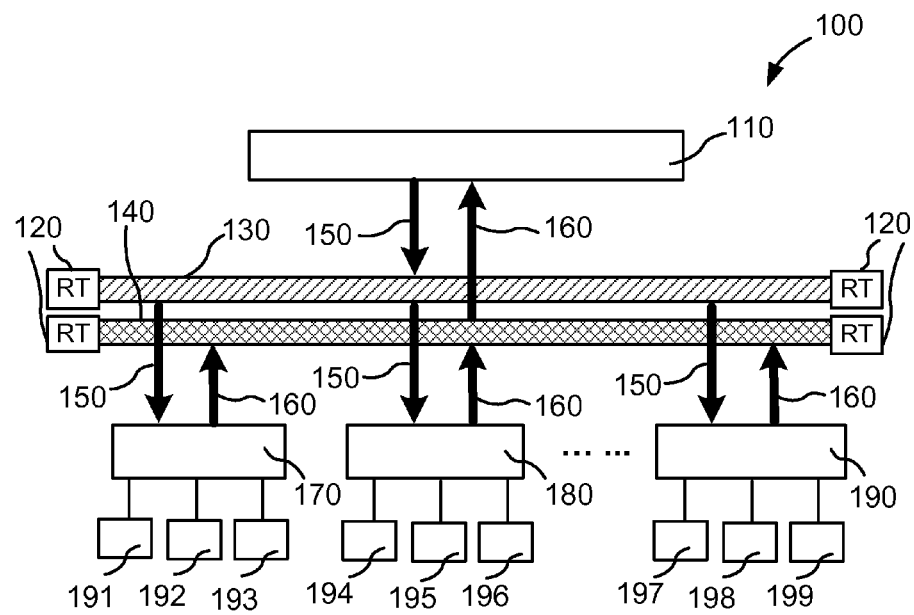
FIG. 1 is a schematic diagram of a communication system in a power converter according to an embodiment of the present invention.

FIG. 1 depicts an exemplary communication system 100 forming part of a power converter apparatus. For example, the communication system 100 can be used to transmit PWM switch commands from a controller to a set of switch drivers for controlling power switches, such as IGBTs, which operate as a power converter in a UPS system.

The communication system 100 includes a controller 110, driver modules 170, 180 and 190, and a communication channel 130. The controller 110 may be, for example, in the form of a core control board based on a Field Programmable Gate Array (FPGA) circuit. Each of the driver modules 170-190 is associated with a set of power switches through switch drivers. Each switch driver has an associated power switch. As such, each driver module can switch on or off its associated power switches through its switch drivers, i.e. setting a state of one of its power switches. For example, the driver module 170 has three power switches 191, 192 and 193 and each of the power switches 191, 192 and 193 may be an IGBT. Each power switch can connect and disconnect one of a set of input power lines (buses) to an output power line. The driver modules 170-190 and power switches 191-199 are shown as an example only and the communication system 100 may have more or fewer driver modules and/or power switches than those shown in FIG. 1. There may be several input power lines and/or several output power lines. For example, the converter may have 9 driver modules. Each of the driver modules 170-190 may be, for example, based on a field programmable gate array (FPGA) circuit with suitable analog circuitry for driving the switch. For example, the power converter may be adapted to generate a three-phase supply, or only single phase. The communication channel 130 is a multiplexed communication bus for transmitting command frames 150 from the controller 110 to the driver modules 170-190. Each command frame 150 from the control 110 to the driver modules 170-190 includes a set of switch commands for at least a subset of power switches 191-199. Each switch command can indicate a desired state of one of the power switches 191-199. The term 'a set of' as described herein means one or more than one.

When the driver modules 170-190 are to drive the power switches 191-199, the power switches 191-199 may be grouped as different subsets of power switches. Each of the different subsets of power switches may be driven by a single driver module. For example, the power switches 191-193 can form a subset of power switches and are driven by the driver module 170. In another example, each of the different subsets of power switches may be driven by different driver modules. Each driver module comprises a plurality of switch drivers and has a single interface with the communication channel 130. For example, the power switches 191, 194 and 197 can form a subset of power switches and are driven by driver modules 170, 180 and 190 accordingly. Therefore, with a set of switch commands in a command frame 150, it is possible to receive the command frame 150 by multiple driver modules at a same instant and set the state or states of the appropriate power switch or switches accordingly. As timing of switch on or off power switches over different driver modules is an important factor in a power converter system, the effect of having a sub set of switch commands multiplexed in a single command frame 150 is to enable sending a command frame 150 to multiple driver modules at a same instant over a single communication channel 130, while also avoiding sending switch commands over multiple communication wires and connector pins.

The communication system 100 may further include a second separate communication channel 140 for transmitting reply frames 160 from one of the driver modules 170-190 to the controller 110. Each of the driver modules 170-190 can use the communication channel 140 to transmit a reply frame 160 to the controller 110. The reply frame 160 is an acknowledgement to the controller 110 from one of the driver modules 170-190 and is sent in response to a command frame 150. However, the communication channel 130 can be configured to have bidirectional data transmission between the controller 110 and the driver modules 170-190. In such a case it would not be necessary to have a separate communication channel 140 for transmitting reply frames 160, and reply frames 160 may be transmitted from one of the driver modules 170-190 to the controller 110 through the communication channel 130. However, in that case, the capacity of the channel 130 to carry time-critical command frames may be impaired. An effect of a dedicated communication channel 130 to transmit frames from the controller 110 to the driver modules 170-190 is to have a predictable transmission delay, because the communication channel 130 is not affected by a driver module sending a reply frame. Due to the communication channel 130, there is no need for collision management. Thanks to the separate communication channel 140, each driver module can reply after receiving a frame. This reply frame is able to reach the controller 110 at the same time as the controller sends a command frame to another driver module. Note that, in the variation a subset of power switches is driven by several driver modules all responding to the same command frame, the acknowledgement/reply mechanism will need to be adjusted so that the driver modules 170-190 avoid sending reply frames 160 through the channel 140, or else to provide some collision management scheme between the driver modules.

Each of the communication channels 130 and 140 may be a low voltage differential signaling (LVDS) system. Such a LVDS system can be configured to bring a unidirectional or bidirectional data transmission between the controller 110 and the driver modules 170-190. For example, the communication channel 130 in the present embodiment includes a main transmission line doubly terminated with a resistor 120, and the controller 110 and the driver modules 170-190 are interconnected on the main transmission line.

Each of the communication channels 130 and 140 is a serial communication channel. Such a serial communication channel can include one or more serial links. The LVDS system can be selected according to a variety of LVDS standards, and in this example is a so-called multipoint LVDS. Multiple serial links can be used for the purpose of redundancy or to increase data rate. The provision of the separate return channel 140 makes the topology full duplex.

It is understood by the skilled person that a system other than a LVDS system can be used for the purpose of the communication channels 130 and 140. For example, the communication channels 130 and 140 may be a wireless communication channel or an optical channel like optical fibers.

As mentioned above, the communication channels 130 and 140 provide a full duplex topology (with a dedicated reply channel 140) to the communication system 100. With this topology, controller 110 can act as a transmitter to send commands over channel 130 to driver modules 170-190, and the driver modules 170-190 can act as a receiver to receive the commands sent from the controller 110. On the return channel 140, each of the driver modules 170-190 can act as a transmitter to send a reply to the controller 110, and the controller can act as a receiver to receive the reply from a driver module. Therefore, the channel 130 is a 1-to-N communication channel, and the channel 140 is a N-to-1 communication channel.

Figure 2:
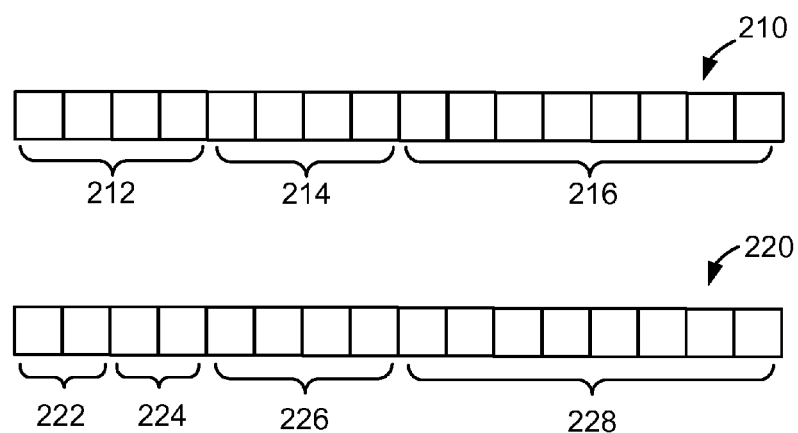
FIG. 2 shows exemplary data frames for transmitting signals in the communication system of FIG. 1.

The command frame 150 and reply frame 160 may have the format of exemplary transmission frames 210 and 220 respectively as shown in FIG. 2. The frames 150 and 160 are sent in accordance with a protocol agreed by both a transmitter and a receiver. Such a protocol may be based on the transport layer of DVB Asynchronous Serial Interface (EN 50083-9) and include an 8b/10b encoder. The skilled person would understand that the frames 150 and 160 are not limited to the transmission frames shown in FIG. 2 and may be based on some other protocol that allows carrying the frame 210 and 220. The protocol may have an error control system. The protocol may also have an error correction code. Such a code is able to be used to automatically correct some transmission error. It improves the transmission system performances, because it avoids the time lost to transmit a corrupted frame again.

According to FIG. 2, the length of the command frame 210 in this example is 16 bits. The switch commands for a set of power switches can be grouped into a series of the frames 210. Each frame 210 can contain switch commands for at least a subset of power switches. Therefore, different frames 210 may contain switch commands for different subsets of power switches. Such a subset of power switches may be driven by a same driver module. The driver module may include a set of switch drivers. The switches may be grouped into subsets logically according to their function, irrespective of whether they are physically driven to a particular driver module. For example, two or more power switches forming part of a single 'leg' in a power converter of the communication system 100 may be deliberately assigned to a same subset. The frame 210 includes a header field 212, an address field 214 and a state field 216.

The header field 212 has four bits configured to contain protocol information indicating to the driver modules 170-190 what type of a protocol the command frame 210 is based on. However, it is understood by the skilled person that the frame 210 need not contain the header field 212 if the data transmission between the controller 110 and the driver modules 170-190 is based on a single-layer transmission protocol, thus providing flexibility for the frame 210 to contain other useful information, or to be shortened.

The address field 214 is configured to contain the address information of a subset of target switch drivers, or a subset of driver modules each of which has different switch drivers. In this example, the 4-bit address field 214 is capable of distinguishing up to sixteen subsets switch drivers or driver modules. One or more address values may be assigned to special functions, such as start-up or emergency commands common to all recipients. It is understood by the skilled person that the frame 210 may not need to contain an address field 214, if the maximum number of the data bits within frame 210 is long enough to represent the maximum number of different subsets of power switches.

The state field 216 is configured to contain switch command information which combines the desired state or states of one or more power switches together. As such, it is possible to multiplex multiple switch commands into a single frame 210 and send the frame 210 through the multiplexed communication channel 130 to the driver modules 170-190, thus providing the possibility for a controller to communicate with a set of driver boards over a single communication channel 130 for controlling a large number of power switches. The number of bits in the state field 216 in this example is eight. This implies that up to eight individual switches can be commanded in a single frame, and can bring consistency in controlling the eight individual power switches, which exceeds the usual number (from 2 to 6) of power switches in a power leg. Where there are more than eight switches in the power converter, the address field 214 identifies which subset of switches is address by these particular state bits. Where it is known that two or more switches will always switch simultaneously, they may share a state bit. In general, however, it will be preferred that every switch is uniquely addressed by its state bit.

Enabling multiplexed signal communication over a single wire between the controller and a set of driver modules reduces the number of connector pins and increases system reliability. It is also easier to apply an electromagnetic compatibility (EMC) shielding to a single wire than to multiple wires.

According to FIG. 2, the length of the reply frame 220 is 16 bits. The frame 220 is an example of a reply frame 160, and the skilled person can understand that other types of a reply frame 160 may also be used. The frame 220 may be configured to be a data frame which includes at least one of the driver module error code, driver module status, communication error code, and driver module measurements such as IGBT temperature. The frame 220 in this example includes a frame status field 222, a driver status field 224, a data ID field 226 and a data field 228.

The frame status field 222 is 2 bits configured to indicate that a command frame 210 received by a driver module is correct and whether switch commands contained that command frame 210 are applied to switch the relevant power switches or not. For example, if the frame status field 222 contains '11', it means that the command frame 210 received by a driver module is correct and switch commands contained that command frame 210 are being applied to switch the relevant power switches; and if the frame status field 222 contains '10', it means that the command frame 210 received by a driver module is incorrect and switch commands contained that command frame 210 are not applied to switch the relevant power switches.

The driver status field 222 is 2 bits configured to indicate a driver status. For example, '11' means a driver in a running mode; '01' means a driver in a configuration mode; '00' means a driver in a fault mode; '10' may be reserved for a certain use in future.

The data ID field 226 is 4 bits configured to indicate what type of data is contained in the data field 228. For example, '0000' can mean that the data contained in the data field 228 is temperature information of a set of power switches; '1000' can mean that the data contained in the data field 228 is temperature information of a driver module; '1001' can indicate that the data contained in the data field 228 is error code information of a driver module; '1010' can indicate that the data contained in the data field 228 is state information of a set of power switches.

The data field 228 is 8 bits configured to contain whatever specific type of data is indicated by the data ID field 226.

As the frame 160 is a reply to the controller 110 from the target driver module with a fixed timing relative to a corresponding command frame 210, it is not necessary to contain the address information of the target switch driver or driver module in the frame 220.

With the exemplary frames 210 and 220 shown in FIG. 2, the communication system 100 has the ability to exchange data containing different types of information, which may, for example, be measurements, device status and errors etc.

In the communication system 100, if a set of power switches are driven by one driver module, the jitter or time variation for setting the states of the set of power switches is zero, because all the switch commands are contained in a single command frame 150. There exists a jitter if a set of power switches are driven by different driver modules in response to different command frames. Also, the transmission time or latency for a frame can be changed by data rate and the length of the frame. For example, if there are 9 driver modules, the shortest transmission time is the transmission time of one frame, and the longest transmission time is the transmission time of nine frames. The communication system 100 may be configured to have no additional time variations, which may for example be due to a system design based on FPGAs and no pipelines etc. As such, the data rate of the communication system 100 can be chosen to obtain a jitter and latency which are negligible in respect of the main constants of the system such as switch period and dead time. As an example, if the transmission protocol is the DVB Asynchronous Serial Interface (EN 50083-9) transportation layer protocol, the data rate is 500 megabits per second. If a frame length is 16 bits, the frame duration is 32 ns, and the maximum latency is 256 ns. If the switching period is about 50 µs to 200 µs and the dead time is about 2 µs, the latency is negligible with respect of the switching period and the dead time.

It may be necessary for the communication system 100 to immediately stop all power switches of each of driver modules 170-190 at an instant. To achieve that, a dedicated frame can be sent by the controller 110 to the driver modules 170-190. Such a dedicated frame may be different from the frames for transferring signals 150 and 160. For example, the length of the dedicated frame can be shorter than that of the frames for transferring frames 150 and 160. After the driver modules 170-190 receive the dedicated frame, the driver modules 170-190 stop all of their power switches immediately.

Figure 3:
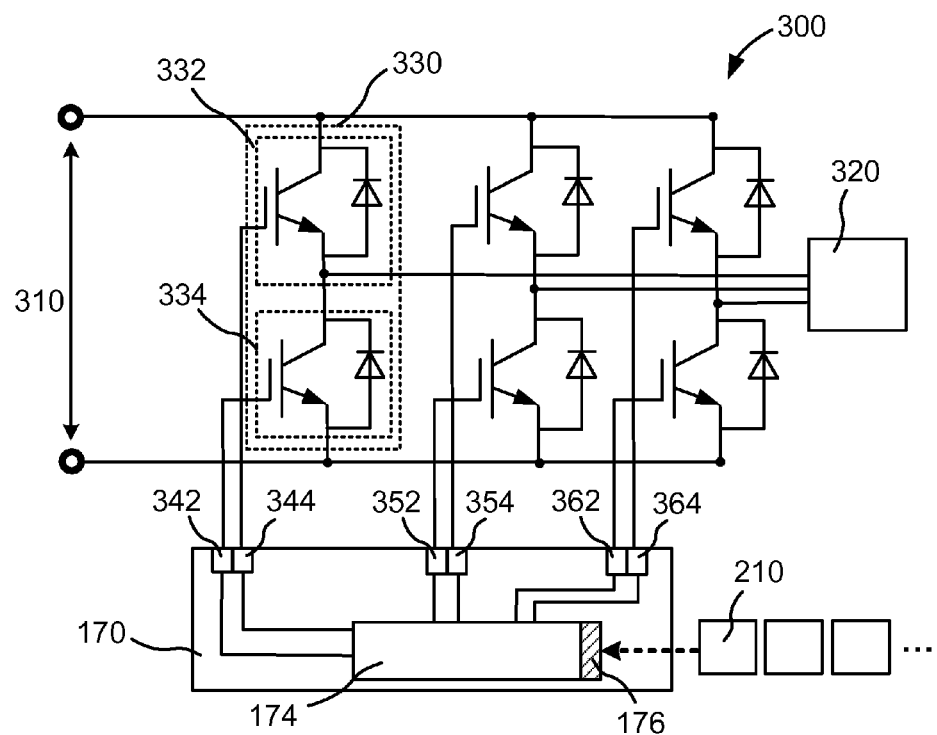
FIG. 3 shows an exemplary circuit diagram of a three-phase power inverter forming part of the power system shown in FIG. 1.

FIG. 3 illustrates a circuit diagram of an exemplary power converter 300 in the form of a three-phase inverter forming part of the power system shown in FIG. 1. In FIG. 3, the driver module 170 controls three legs of the power converter 300 through six switch drivers 342-364. Each leg includes a top power switch and a bottom power switch. For example, a leg 330 includes a top IGBT 332 and a bottom IGBT 334.

It will be understood by the skilled reader that a power converter of the power system is not limited to such exemplary inverter 300, converting DC power to AC power. For example, a power converter may also be used to convert power from a main input to an internal DC voltage, from a DC voltage to a battery, from an internal DC voltage to a second internal DC voltage. Therefore other topologies of power converter are possible, not only the inverter illustrated in FIG. 3.

The driver module 170 includes an interface module 174 with an interface 176 for receiving a command frame 210 and sending a reply frame 220. The interface 176 is configured to cooperate with communication channels 130 and 140 for data transmission. For example, the interface 176 may be a serial bus interface, or a wireless transceiver module. Upon receiving a command frame 210 through interface 176, interface module 174 can extract individual switch commands from the frame 210, and send individual switch commands to each of the switch drivers 342-364 simultaneously. The driver module 170 can control one or more legs of power converters to supply electricity from a power source 310 to a load 320.

Figure 8:
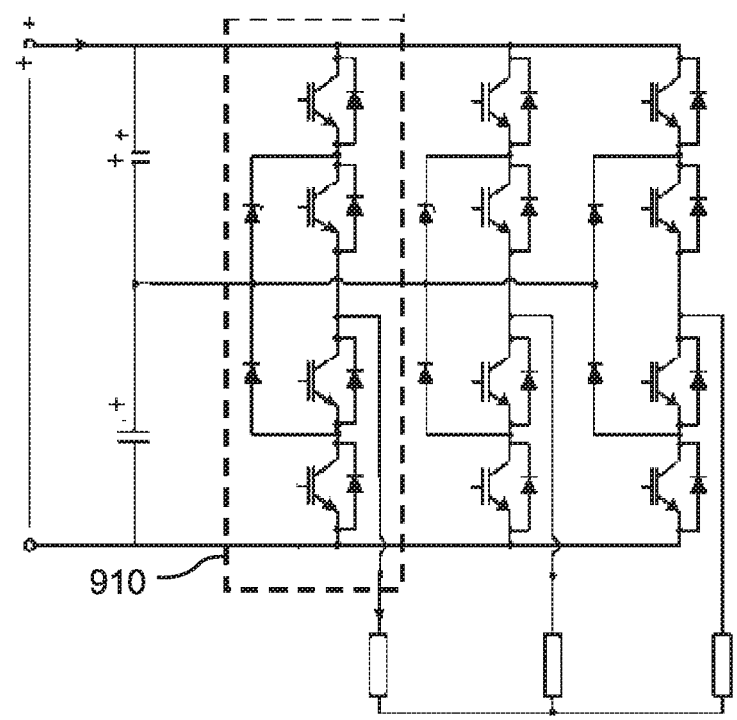
FIG. 8 shows an exemplary circuit diagram of a neutral point clamped power topology forming part of the power system shown in FIG. 1.
Figure 9:
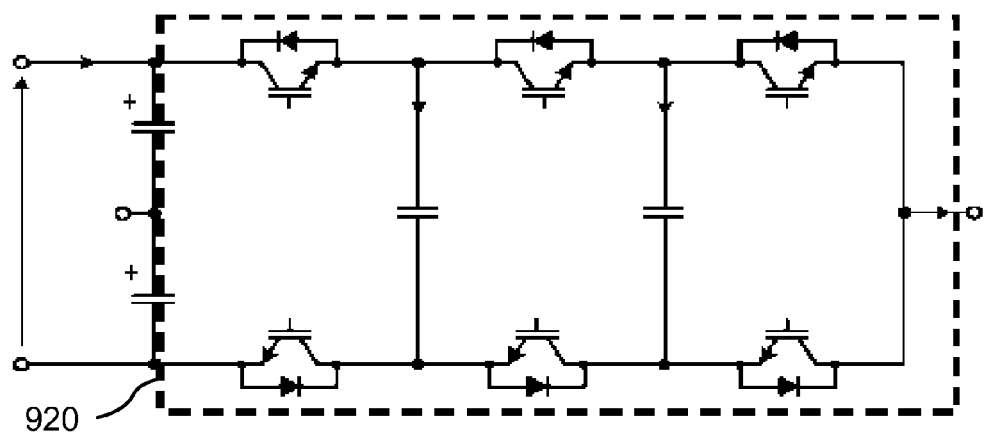
FIG. 9 shows an exemplary circuit diagram of a flying capacitor power topology forming part of the power system shown in FIG. 1.
Figure 10:
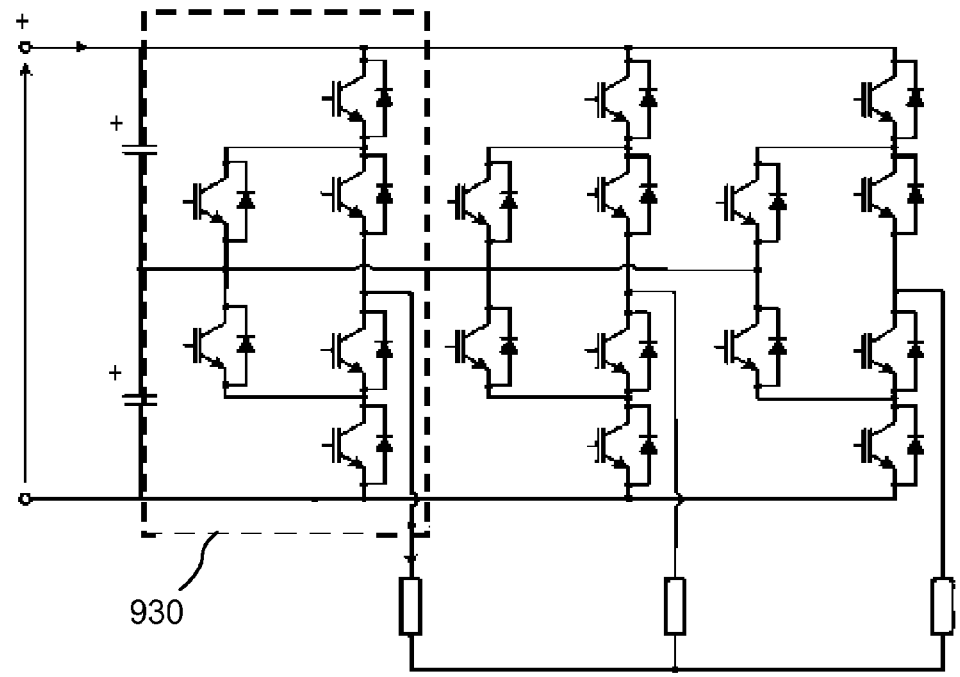
FIG. 10 shows an exemplary circuit diagram of an active neutral point clamped power topology forming part of the power system shown in FIG. 1.

In this simple illustration, each leg is associated with a separate output line, giving a three-phase supply to load 320. It is understood by the skilled person that the power system shown in FIG. 1 may use other power topologies, such as multilevel inverters, DC boost converters, H-bridge inverters. Such topologies may include more than two switches (IGBTs) per leg. FIG. 8 for example illustrates a neutral point clamped power topology, in which one leg 910 contains four switches. FIG. 9 illustrates a flying capacitor power topology in which a leg 920 contains six switches. FIG. 10 illustrates an active neutral point clamped topology in which a leg 930 contains six switches. In each example, the designer can identify a sub-set of switches, such as those forming a leg 330, 910, 920, 930, which should be switched in close synchronism, using a same command frame. It is a feature of some embodiments that commands for switches in the same leg are grouped together in the same subset and controlled via the same frame. In this way, the relative timing of commands for switches within the same leg can be kept tightly controlled, while the benefit of multiplexing the commands over a serial communication channel can also be realized.

Figure 4:
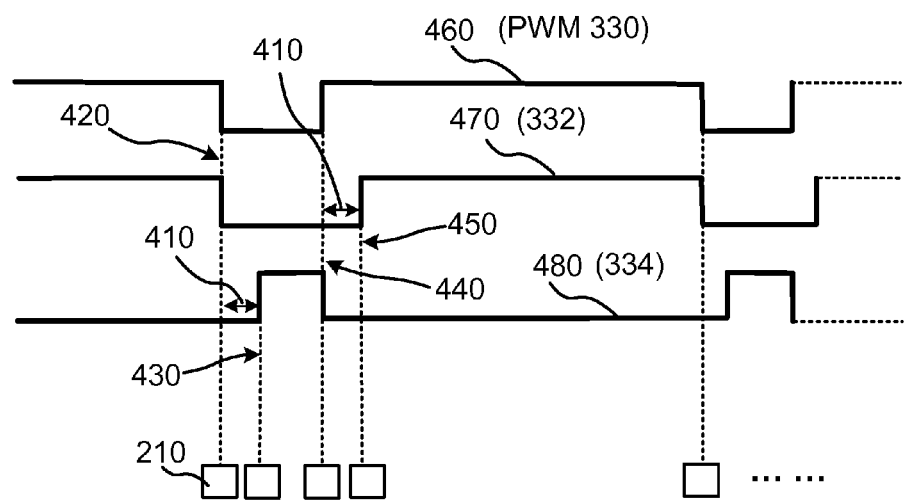
FIG. 4 shows an exemplary waveform for controlling the power switches on a leg 330 of the circuit shown in FIG. 3.

FIG. 4 illustrates an exemplary waveform for controlling the power switches 332 and 334 on the leg 330 shown in FIG. 3. These waveforms are generated within controller 110 (FIG. 1). The top waveform 460 in FIG. 4 illustrates an ideal PWM waveform for the leg 330.

In response to the PWM waveform 460, the aim of the controller 110 and the communications systems is to ensure that the driver module 170 turns off the top IGBT 332 at one instant (420) and after a time delay 410 turn on the bottom IGBT 334 at another instant (430). The time delay 410 may be between 0.3 µs and 3 µs. The time delay 410, also called dead time, is to ensure that there is no possibility of both transistors conducting at the same time. Dead time 410 is necessary to prevent short circuit of the power source 310 through the power converters 332 and 334 on the leg 330. For example, the controller 110 may generate the waveform 460 for the power switches 332 and 334 on the leg 330 according to an overall power requirement on the power converter. With a dead time 410, the controller 110 then determines the waveforms 470 and 480 for the power switches 332 and 334 respectively. These waveforms 470 and 480 represent the switch commands that conventionally would be conveyed to the appropriate switch driver by separate wires.

To convey these commands through the multiplexed channel 130, controller 110 sends a first frame 210 to the driver module 170 at an instant 420. Upon receiving the frame 210, the driver module 170 extracts the state bits corresponding to switches 332 and 334 and turns off the top IGBT 332 at the instant 420. After a dead time 410 from the instant 420, the controller 110 sends a second frame 210 to the driver module 170 at an instant 440 and the driver module 170 turns on the bottom IGBT 334 at an instant 430. The controller 110 sends a third frame 210 to the driver module 170 at an instant 430. Upon receiving the frame 210, the driver module 170 turns off the bottom IGBT 334 at the instant 440. After a dead time 410 from the instant 430, the controller 110 sends a fourth frame 210 to the driver module 170 at an instant 450, and the driver module 170 turns on the top IGBT 332 at the instant 450. To send the frames 210 in sequence, the controller 110 can have a transmission stack module to store frames 210 which are, for example, predetermined for controlling the power switches 332 and 334 on the leg 330 according to the waveforms 470 and 480. The transmission stack module is configured to buffer frames 210 according to a first-in-first-out (FIFO) principle. A size (which may, for example, be an average size, or a maximum/minimum size) of the transmission stack module and a transmission time delay can be predetermined. The delay, or at least a variation on the delay, should be much less than the timing resolution required in the switching. References to "instants" should be construed accordingly.

To protect against abnormal time delays or transmission errors in transmitting frames between the controller 110 and one of the driver modules 170-190, the driver module 170 may implement additional checks before obeying command extracted from a command frame. One such check is to have a dead time security module to ensure that, after there is a state transition on one of the legs such as the leg 330, no other state changes are allowed on that leg during a dead time period. Such a dead time security module can prevent a violation of changing power switch state during the dead time due to the abnormal time delays or transmission errors. Also, each of the driver modules 170-190 may have a short circuit check, to ensure that a command which appears to result in a short circuit on one of the legs such as leg 330 is not obeyed. Module 170 can return an error message through a frame 160 indicating this.

Figure 5:
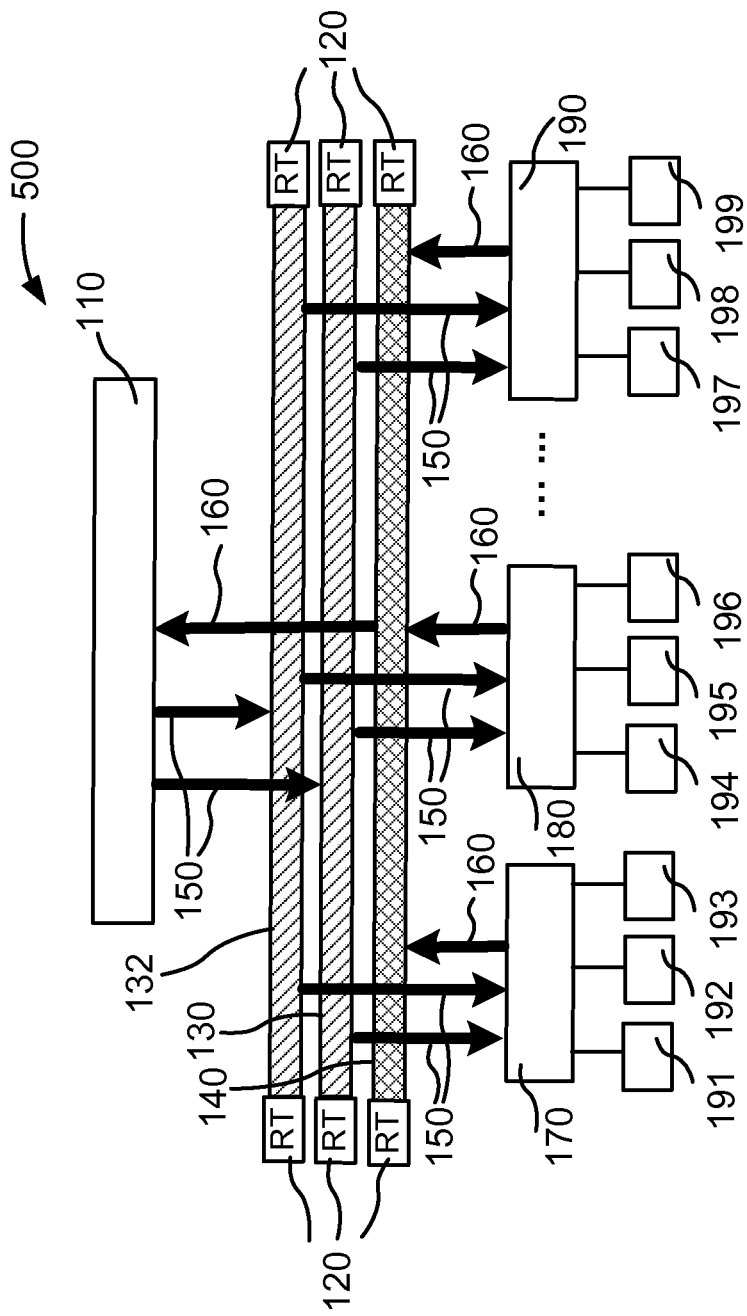
FIG. 5 shows a block diagram of a communication system according to an embodiment of the present invention.

FIG. 5 depicts an exemplary communication system 500 according to second embodiment of the present invention. The communication system 500 is similar to the communication system 100 shown in FIG. 1. However, the communication system 500 includes an additional separate communication channel 132 for transmitting command frames 150 to the driver modules 170-190. As such, the controller 110 can transmit two identical command frames 150 in parallel, optionally with a slight time delay, over the communication channels 130 and 132 to the driver modules 170-190. Each of the driver modules 170-190 has an error control module to process the duplicated command frames 150 transmitted separately through the communication buses 130 and 132. For example, the error control module compares whether the contents of two command frames 150 are same, and if not, the error control module determines that at least one of the command frames 150 is wrong and requests the controller 110 to resend the command frames 150.

Figure 6:
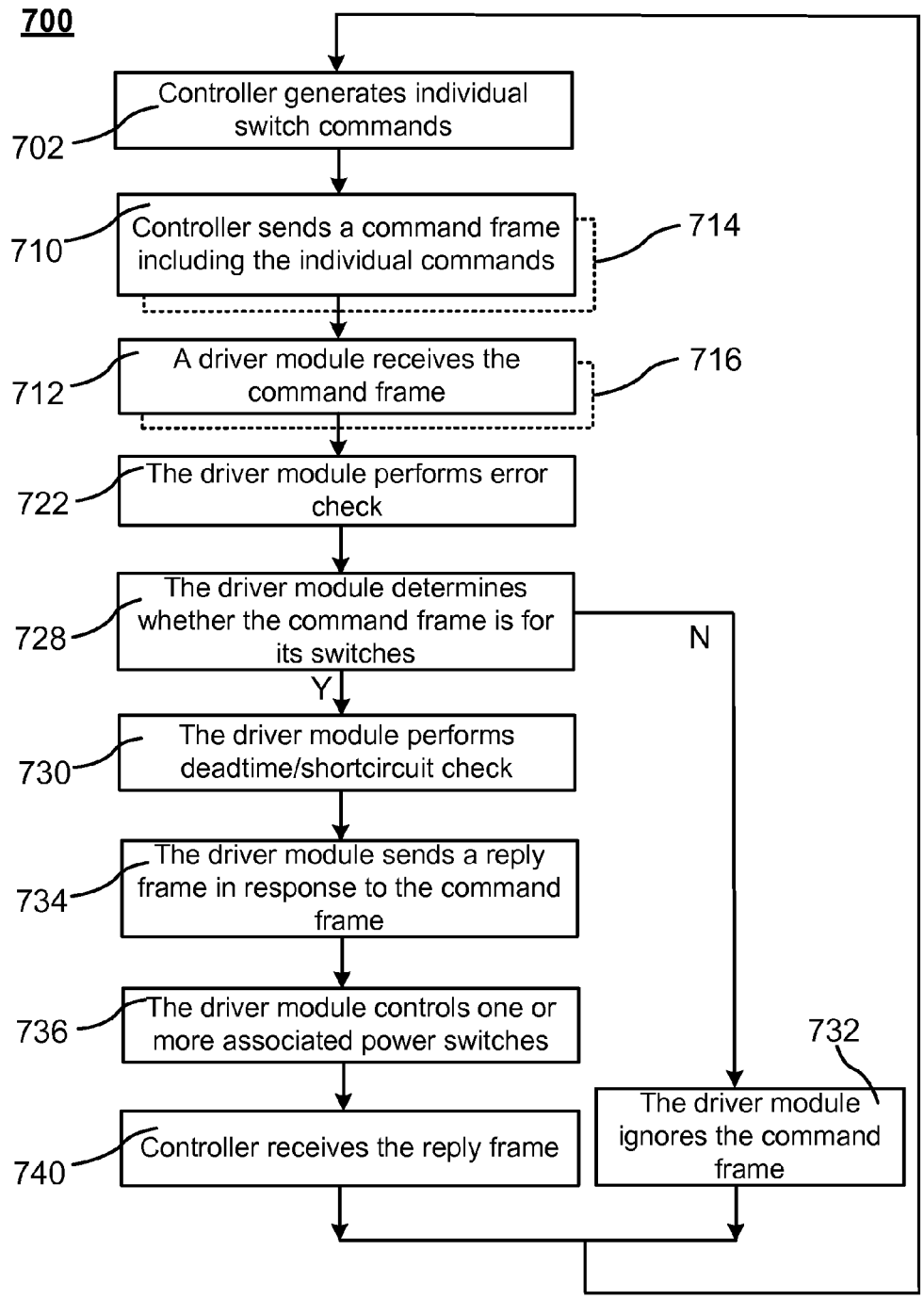
FIG. 6 shows a flow chart of operations in the power converter according to an embodiment of the present invention.
Figure 7:
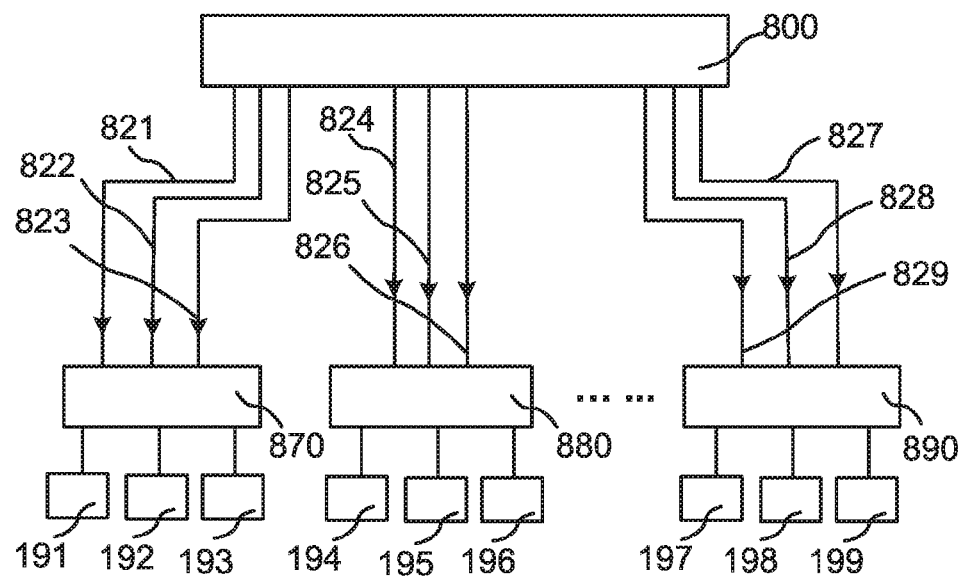
FIG. 7 shows a schematic diagram of a conventional system for use in a power converter.

FIG. 6 illustrates an exemplary method 700 for controlling a set of power switches 191-199 operating as a power converter according to the above embodiment of the present invention. The method 700 can, for example, be used in a UPS system. The method is provided with a set of power switches 191-199 and driver modules 170-190. Each of the power switches 191-199 is operable to connect and disconnect one of input power lines to an output power line. The power switches 191-199 are driven by driver modules 170-190, and each of the driver modules 170-190 is operable to set the state of a power switch through a switch driver.

702. The controller 110 generates individual switch commands for at least a subset of power switches (for example, power switches 191-193) from the power switches 191-199. Each individual switch command indicates a desired state of a power switch at a moment in time. The controller 110 may generate individual switch commands by sampling according to the PWM waveform of a power converter and generating switch command events corresponding the exemplary waveforms 470, 480 shown in FIG. 4, a transmission stack by.

710. For each command event, controller 110 sends a command frame 150 to the driver modules 170-190. The command frame 150 is a multi-bit frame. The multi-bit frame may be in a form as described above. To send the command frame 150, the controller 110 groups together the individual commands into the state bit field of command frame 150. Note that state bits for all of the addressed switches may be carried, even if only one of the switches should be changing state.

712. Driver modules 170-190 receive the command frame 150.

The method 700 may further include steps 714 and 716, when two communication channels 130, 132 are used in parallel for redundancy and error protection.

714. The controller 110 sends the same command frame 150 at a second instant to the driver modules 170-190, over a parallel channel. The second instant is different with the instant in step 710, and the time gap between the first instant and the instant in step 710 may be only the duration of a couple of bits of the frame, which may be for example between 5 and 50 nanoseconds. Selecting the delay of a duration of a couple of bits of the frame is that a bit error does not occur exactly at the same bit position of the two command frames 150, which also give the error detection module an additional chance to detect and/or correct a transmission error.

716. Driver modules 170-190 receive the same command frame 150.

722. An error control module of each of the driver modules 170-190 performs an error check. It is understood that in step 722 the error control module of a driver module may use the two received command frames 150 to perform an error check by comparing whether the command frame 150 sent at an instant in step 710 is same to the command frame 150 sent at the second instant in step 712. If the two command frames 150 are different, the error check fails and one of the driver module 170-190 may send a reply indicating such failure to the controller 110. In such a case, it may be unnecessary to perform the following steps of the method 700. Upon receiving such a reply, the controller 110 may perform the method 700 again. However, it is understood that if a driver module cannot read the address of a frame 150 due to an error of the command frame 150, the driver module does not send a reply to the controller 110.

An error may occur in a frame due to the noise interference or electromagnetic interference etc. There are several ways to detect an error in the frame. For example, the protocol used by the controller and the driver module 170-190 for data transmission can have an error control mechanism for detecting an error during data transmission, which may for example be an error-correcting code or a field in the frames 210 and 220 for cyclic redundancy check (CRC). If an error-correcting code is used for error detection, the error-correcting code may include additional information for a receiver to recover the data without an error. Although the additional information may increase the frame length and have slight transmission delay, it can avoid the retransmission of a frame. If a CRC field is used for error detection, the CRC field may be added as an additional field with 3 or 4 bits into the frames 210 and 220 as shown in FIG. 2 so that the length of the frames 210 and 220 is longer than 16 bits.

If the error check fails, at least one of the driver modules 170-190 may send a reply indicating such failure to the controller 110 and it may be unnecessary to perform the following steps. Upon receiving such a reply, the controller 110 may perform the whole method 700 again, or repeat sending the frames first. However, it is not necessary for a driver module to reply if the error check fails, as the controller 110 knows that a transmission error has occurred if it does not receive any acknowledgement from one of the driver modules 170-190. A driver module may only send a reply frame to the controller if the driver module understands a command frame.

728. Each of the driver modules 170-190 determines whether the command frame 150 is for itself. As the command frame 150 includes an address field containing the address of a subset of switches, each of the driver modules170-190 can determine according to the information in the address field whether it shall set the state of one or more of its power switches according to the command frame 150.

730. If one of the driver modules 170-190 determines that the command frame 150 is for itself, the driver module performs a check on whether any of the switch commands in the command frame 150 would violate a dead time restriction and/or lead to a short circuit on a leg of the power converter.

732. If one of the driver modules 170-190 determines that the command frame 150 is not for itself, the driver module ignores the command frame 150.

734. In response to a positive determination at 730, the driver module sends a reply frame 160 to the controller 110 as a reply to the switch command signal 150. The reply frame 160 may contain an error indicating a failure of the dead time/short circuit check in 730. It is understood that the step 734 of replying to the controller 110 happens when the dedicated communication channel 140 is used for transmitting reply frames 160. However, the step 734 of replying to the controller 110 does not happen if the dedicated communication channel 140 is not present. In such case, as the controller 110 does not know whether the commands in a command frame 150 are received and applied to the relevant power switches, it may be necessary to include an error-correcting code in the command frame 150 so that an error in the command frame 150 can be corrected by the driver modules 170-190.

736. According to the individual switch commands, the driver module controls one or more of power switches associated through switch drivers by setting the state of the power switches. However, the driver module may not perform this step if the command frame 150 fails either the error check in 722 or the dead time/short circuit check in 730.

740. The controller 110 receives the reply frame 160 sent in step 734. The controller 110 can use the data contained in the reply frame 160 for a number of purposes. For example, the controller 110 may stop one or more driver modules 170-190 and even the power converter apparatus in case that the data contained the reply frame 160 indicate a dead time violation and/or an abnormal operation condition of a driver module such as an over temperature on the driver module.

It is understood by the skilled person that the method 700 may perform at each time when it is necessary to send a PWM switch command in a communication system 100 as described above. For example, the controller can sample periodically the requested states of all power switches. Each time the controller detects that a requested state of a power switch has changed, it sends a command frame 150 containing the corresponding switch state. If the power switches of a driver module have not changed for a while, the controller may send a command frame 150 to the driver module for the purpose of receiving a reply frame 160 through the dedicated communication channel 140 to obtain data information from the driver module. The method may be repeated more frequently, if desired, sending a continuous stream of command frames.

While specific embodiments of the invention have been described above, it is to be understood that the embodiments described herein can be implemented in hardware, software, firmware, middleware, microcode, or any combination thereof. For example, the invention may take the form of a computer program containing one or more sequences of machine-readable instructions which, when executed by a computer, causes the computer to perform one or more methods described above.

When the embodiments are implemented in software, firmware, middleware or microcode, program code or code segments, they can be stored in a machine-readable medium, such as a storage component. The term "machine-readable medium" can include, without being limited to, wireless channels and various other media capable of storing, containing, and/or carrying instruction(s) and/or data. A code segment can represent a procedure, a function, a subprogram, a program, a routine, a subroutine, a module, a software package, a class, or any combination of instructions, data structures, or program statements. A code segment can be coupled to another code segment or a hardware circuit by passing and/or receiving information, data, arguments, parameters, or memory contents. Information, arguments, parameters, data, etc. can be passed, forwarded, or transmitted using any suitable means including memory sharing, message passing, token passing, network transmission, etc.

For a software implementation, the techniques described herein can be implemented with modules (e.g., procedures, functions, and so on) that perform the functions described herein. The software codes can be stored in memory units and executed by processors. The memory unit can be implemented within the processor or external to the processor, in which case it can be communicatively coupled to the processor via various means as is known in the art.

For a hardware implementation, the processing units can be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. All of the processes described above may be embodied in, and fully automated via, functional code modules executed by one or more general purpose electronic devices or processors. The code modules may be stored in any type of non-transitory machine-readable medium or other storage device. Some or all of the methods may alternatively be embodied in specialized hardware. Depending on the embodiment, the non-transitory machine-readable medium may be a hard disk drive, a compact disc, a digital video disc, a tape drive or other suitable storage medium.

The invention claimed is:

1. A method for controlling a set of power switches operating as a power converter, the method comprising:
    providing the set of power switches and at least one switch driver, each power switch being operable to connect and disconnect one of a set of input power lines to an output power line, the at least one switch driver setting a state of an associated power switch or switches;
    generating by a controller a set of switch commands, each of the switch commands indicating a desired state of a respective one of said power switches at a moment in time;
    sending each of the switch commands from the controller to a driver module containing the at least one switch driver associated with the respective power switch;
    receiving at the driver module the switch commands for the respective power switch; and
    causing the at least one switch driver to set the state of the respective power switch;
    wherein sending said switch commands comprises multiplexing commands for at least a subset of said power switches into a series of multi-bit command frames and transmitting said multi-bit command frames on a serial communication channel,
    wherein each multi-bit command frame includes a plurality of switch command bits, each of the plurality of switch command bits representing one of said switch commands, and an address field identifying the subset of power switches to which the switch command bits relate, and
    wherein receiving said switch commands comprises receiving said multi-bit command frames from said serial communication channel and extracting individual switch commands therefrom.

2. The method according to claim 1, wherein switch commands for different subsets of said power switches are combined in different multi-bit command frames and sent at different times via the same serial communication channel.

3. The method according to claim 1, wherein switch commands for power switches forming part of a single leg in the power converter are combined in one multi-bit command frame.

4. The method according to claim 1, wherein each multi-bit command frame includes switch commands for power switches driven by a switch driver within a single driver module, while switch commands for power switches driven by switch drivers within a different driver module are combined in a different multi-bit command frame and sent at different times via the same serial communication channel.

5. The method according to claim 1, wherein the address field identifies a subset of power switches driven by a single driver module comprising a plurality of switch drivers and having a single interface to said serial communication channel.

6. The method according to claim 1, wherein the address field identifies a subset of power switches driven by different single driver modules, each driver module comprising a plurality of switch drivers and having a single interface to said serial communication channel.

7. The method according to claim 1, further comprising:
    after receiving said switch commands, checking said switch commands according to predetermined criteria defining forbidden switch states.

8. The method according to claim 7, further comprising:
    sending an error message to the controller in the event that a switch command received via the serial communication channel results in a forbidden switch state.

9. The method according to claim 7, wherein said forbidden switch states include a state in which two power switches in a leg of the power converter are on at a same time, leading to a short circuit of said input power line.

10. The method according to claim 7, wherein said forbidden switch states include a state in which a minimum dead time is not provided in a leg of the power converter.

11. The method according to claim 1, wherein the serial communication channel is a low voltage differential signal bus.

12. The method according to claim 1, further comprising:
    in response to a received multi-bit command frame, sending from at least one of the subset of power switches a reply frame to the controller over a first communication channel;
    wherein the controller sends the command frames through a second communication channel.

13. The method according to claim 12, wherein the reply frame is sent to the controller over the first communication channel while the controller sends the multi-bit command frames through the second communication channel.

14. The method according to claim 1, further comprising:
    sending from the controller two or more of the same multi-bit command frames at different instants over separate communication channels.

15. A controller for use in a power converter having a set of power switches, the controller being configured to:
    generate a set of switch commands, each switch command indicating a desired state of one of said power switches of the power converter at a moment in time;
    multiplex commands for at least a subset of said power switches into a series of multi-bit command frames, wherein each multi-bit command frame includes a plurality of switch command bits, each of the plurality of switch command bits representing one of said switch commands, and an address field identifying the subset of said power switches to which the plurality of switch command bits relate; and
    send the multi-bit command frames on a serial communication channel to a driver module associated with at least one of the subset of said power switches.

16. The controller according to claim 15, wherein the controller is configured to:
    combine switch commands for different subsets of said power switches into different multi-bit command frames; and
    send the multi-bit command frames at different times via the same serial communication channel.

17. The controller according to claim 15, wherein the controller is configured to:
    combine switch commands for power switches forming part of a single leg in the power converter into one multi-bit command frame.

18. The controller according to claim 15, wherein each multi-bit command frame includes switch commands for power switches driven by a switch driver within a single driver module, while switch commands for power switches driven by switch drivers within a different driver module are combined in a different multi-bit command frame and sent at different times via the same serial communication channel.

19. The controller according to claim 15, wherein the address field identifies a subset of switches driven by a single driver module comprising a plurality of switch drivers and having a single interface to said serial communication channel.

20. The controller according to claim 15, wherein the address field identifies a subset of switches driven by different single driver modules, each driver module comprising a plurality of switch drivers and having a single interface to said serial communication channel.

21. The controller according to claim 15, wherein the controller is configured to receive an error message in the event that a switch command received via the serial communication channel results in a forbidden state.

22. The controller according to claim 21, wherein said forbidden state includes a state in which two power switches in a leg of the power converter are on at a same time, leading to a short circuit of an input power line.

23. The controller according to claim 21, wherein said forbidden state includes a state in which a minimum dead time is not provided in a leg of the power converter.

24. The controller according to claim 15, wherein the serial communication channel is a low voltage differential signal bus.

25. The controller according to claim 15, wherein the controller is configured to:
receive a reply frame from at least one of the subset of said power switches over a first communication channel;
wherein the controller sends the multi-bit command frames through a second communication channel.

26. The controller according to claim 25, wherein the controller sends the multi-bit command frames through the second communication channel while the reply frame is sent to the controller over the first communication channel.

27. The controller according to claim 15, wherein the controller is configured to send two or more of the same multi-bit command frames at different instants over separate communication channels.

28. The controller according to claim 16 in combination with at least one driver module configured to:
receive the multi-bit command frames over the serial communication channel;
extract individual switch commands from the multi-bit command frames; and
set the state of the appropriate power switches according to the individual switch commands.

29. A driver module for use in a power converter having a set of power switches, the driver module being configured to:
receive over a serial communication channel a series of multi-bit command frames from a controller, said multi-bit command frames including a plurality of switch command bits, each of the plurality of switch command bits representing a switch command for one or more of said power switches, each switch command indicating a desired state of a respective one of said power switches at a moment in time, and an address field identifying the one or more of said power switches to which the plurality of switch command bits relate;
extract individual switch commands from the multi-bit command frames; and
set the state of the appropriate power switches.

30. The driver module according to claim 29, wherein the driver module is configured to receive different multi-bit command frames at different time via the same serial communication channel;
wherein switch commands for different subsets of said power switches are combined in said different multi-bit command frames.

31. The driver module according to claim 29, wherein switch commands for power switches forming part of a single leg in the power converter are combined in one multi-bit command frame.

32. The driver module according to claim 29, wherein each multi-bit command frame includes switch commands for power switches driven by a switch driver within a single driver module.

33. The driver module according to claim 29, wherein the address field identifies a subset of switches driven by a single driver module comprising a plurality of switch drivers and having a single interface to said serial communication channel.

34. The driver module according to claim 29, wherein the address field identifies a subset of switches driven by different single driver modules, each driver module comprising a plurality of switch drivers and having a single interface to said serial communication channel.

35. The driver module according to claim 29, wherein the driver module is configured to:
check said switch commands according to predetermined criteria defining forbidden switch states after receiving said switch commands.

36. The driver module according to claim 35, wherein the driver module is configured to:
send an error message to the controller in the event that a switch command received via the serial communication channel results in a forbidden switch state.

37. The driver module according to claim 35, wherein said forbidden switch state includes a state in which two power switches in a leg of the power converter are on at a same time, leading to a short circuit of said input power line.

38. The driver module according to claim 35, wherein said forbidden switch state includes a state in which a minimum dead time is not provided in a leg of the power converter.

39. The driver module according to claim 29, wherein the serial communication channel is a low voltage differential signal bus.

40. The driver module according to claim 29, wherein the driver module is configured to send a reply frame to the controller over a first communication channel, and receive the multi-bit command frames through a second communication channel.

41. The driver module according to claim 40, wherein the driver module is configured to send the reply frame to the controller over the first communication channel while the controller sends the multi-bit command frames through the second communication channel.

42. The driver module according to claim 29, wherein the driver module is configured to receive two or more of the same multi-bit command frames from the controller at different instants over separate communication channels.

* * * * *